United States Patent [19]

Matsuoka

[11] Patent Number: 5,365,110
[45] Date of Patent: Nov. 15, 1994

[54] SEMICONDUCTOR DEVICE WITH MULTI-LAYERED WIRING STRUCTURE

[75] Inventor: Fumitomo Matsuoka, Kawasaki, Japan

[73] Assignee: Kabushuki Kaisha Toshiba, Kawasaki, Japan

[21] Appl. No.: 96,844

[22] Filed: Jul. 26, 1993

Related U.S. Application Data

[63] Continuation of Ser. No. 834,976, Feb. 13, 1992, abandoned, which is a continuation of Ser. No. 608,344, Nov. 2, 1990, abandoned.

[30] Foreign Application Priority Data

Nov. 7, 1989 [JP] Japan .................. 1-288005

[51] Int. Cl.$^5$ ............ H01L 23/48; H01L 29/46; H01L 29/62; H01L 29/64
[52] U.S. Cl. ............ 257/762; 257/742; 257/765; 257/369
[58] Field of Search .......... 357/42.71; 257/369, 257/382, 383, 422, 741, 762, 765, 529, 530, 376

[56] References Cited

U.S. PATENT DOCUMENTS

| 4,513,309 | 4/1985 | Cricchi | 257/376 |
| 4,647,340 | 3/1987 | Szluk et al. | 257/530 |
| 4,677,735 | 7/1987 | Malhi | 357/42 |
| 4,879,582 | 11/1989 | Kimura et al. | 357/71 |
| 4,937,652 | 6/1990 | Okumura et al. | 357/67 |
| 5,061,981 | 10/1991 | Hall | 257/382 |

OTHER PUBLICATIONS

1989 Symposium on VLSI Technology, Digest of Technical Papers, "A Generalized Lifetime Model for Electromigration Under Pulsed AC/DC Stress Conditions", IEEE Cat. No. 89 CH 2694-8, pp. 19-20, K. Hatanaka et al.

*Primary Examiner*—J. Carroll
*Attorney, Agent, or Firm*—Finnegan, Henderson, Farabow, Garrett & Dunner

[57] ABSTRACT

A semiconductor circuit includes a signal line for transmitting bidirectional pulse currents and a power line for supplying a DC current, and the signal line and the power line are formed of different metal wiring layers. The power line is formed of a metal having higher melting point, higher electromigration resistance and lower resistivity than those of the signal line. As a result, the reliability of the wiring of the semiconductor device can be improved.

8 Claims, 2 Drawing Sheets

SEMICONDUCTOR DEVICE WITH MULTI-LAYERED WIRING STRUCTURE

This application is a continuation of Ser. No. 07/834,976, filed Feb. 13, 1992, abandoned, which is a continuation of application Ser. No. 07/608,344, filed Nov. 2, 1990, abandoned.

BACKGROUND OF THE INVENTION

1. Field of the Invention

This invention relates to a semiconductor device with a multi-layered wiring structure, and more particularly to a semiconductor device having two- or more-layered wiring layers each formed of metal.

2. Description of the Related Art

In a recent LSI circuit (large scale integrated circuit) such as a gate array and a CPU (central processing unit), wirings each formed of two or more layers are used to increase the integration of the circuit. Wirings in the LSI are classified as a power line for supplying electric power to the circuit elements and a signal line for transferring various signals to the circuit elements. As shown in FIG. 1, in a CMOS-LSI (CMOS type integrated circuit) having a CMOS inverter constituted by a P-channel MOSFET 31 and an N-channel MOSFET 32, for example, a wiring shown in a thick solid line is a power line 33. A wiring shown in thick broken line is a signal line 34. A DC voltage is applied to the power line 33. A DC current flows in the power line 33 or a DC pulse current intermittently flows according to ON/OFF operations of the circuit elements in the power line 33. In general, the current in the power line 33 flows only in one direction. In contrast, a pulse current in the signal line 34, particularly in the signal line 34 of the CMOS-LSI, flows in both directions as a charging or discharging current with respect to a capacitive load.

As shown in FIG. 2, in the conventional semiconductor device with multi-layered wiring structure, only aluminum or aluminum alloy is used as a metal of the multi-layered wirings 33 and 34. Therefore, in circuit layout in which such multi-layered wirings should be used, the power line 33 and the signal line 34 are not needed to be distinguished clearly from each other. In the device in FIG. 2, reference numeral 1 denotes a silicon semiconductor substrate; 3, a well region; 4 and 5, P$^+$-type diffusion regions; 6 and 7, N$^+$-type diffusion regions; 8 and 9, polysilicon layers; and 10, a field oxide film.

In the semiconductor device, a maximum current capable of flowing in the wiring is influenced by abrasion failure which is called "electromigration". The rated value of the maximum current is ordinarily determined by a test upon which a DC current is flowed in the wiring. The rated value is, for example, approx. $1 \times 10^5$ (A/cm$^2$). Since a relatively large current flows in the power line, the conventional power line may be formed as wide as possible. However, as the circuit elements are miniaturized in a fine pattern, it becomes difficult to obtain the rated value determined by the DC current needed for the power line. Moreover, in the prior art, since the size of the whole chip is not changed even if the sizes of the internal circuit elements and the wirings are reduced in a fine pattern, more particularly, since the lengths of the wirings are not changed but the power source voltage becomes low together with the miniaturized size of the circuit elements, erroneous operation caused by a voltage drop in the power line occurs as a serious problem.

It is well known in the art that there is a certain correlation between a melting point and an electromigration resistance of the metal. A metal such as tungsten having a high melting point can be used as the wiring material. If the wiring of tungsten is used as the signal line, a delay time for signal transmission due to the electric resistance of the tungsten wiring will not cause any problem, since the length of the signal line per a switching element tends to be shortened as the integrated circuit is miniaturized in a fine pattern. However, if the tungsten wiring is used as the power line, the electric resistance thereof is higher than that of the aluminum by several orders and thus the operation error due to the voltage drop becomes a serious problem. Therefore, it is difficult to use the wiring of the tungsten as the power line.

SUMMARY OF THE INVENTION

The present invention has been made in consideration of the above problems, and it is an object of the present invention to provide a highly reliable semiconductor device with multi-layered wiring structure.

A semiconductor device with multi-layered wiring structure of the present invention comprises a first wiring for supplying electric power to each of the switching elements; and a second wiring for transmitting signals between the switching elements, the first and second wirings being formed of different metals.

According to the present invention, the first wiring for supplying electric power to each of the switching elements and the second wiring for transmitting signals between the switching elements are formed of different metals. That is, a metal having a low resistivity and a high melting point is used to form the first wiring so that the electromigration resistance in the first wiring can be improved and also the voltage drop can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

There will now be described an embodiment of the present invention hereinafter with reference to the accompanying drawings.

Figure 1:
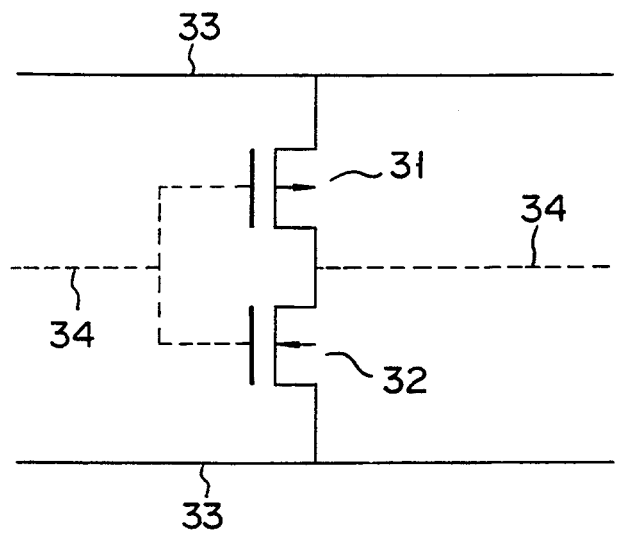
FIG. 1 is a schematic circuit diagram showing a common CMOS-LSI.
Figure 2:
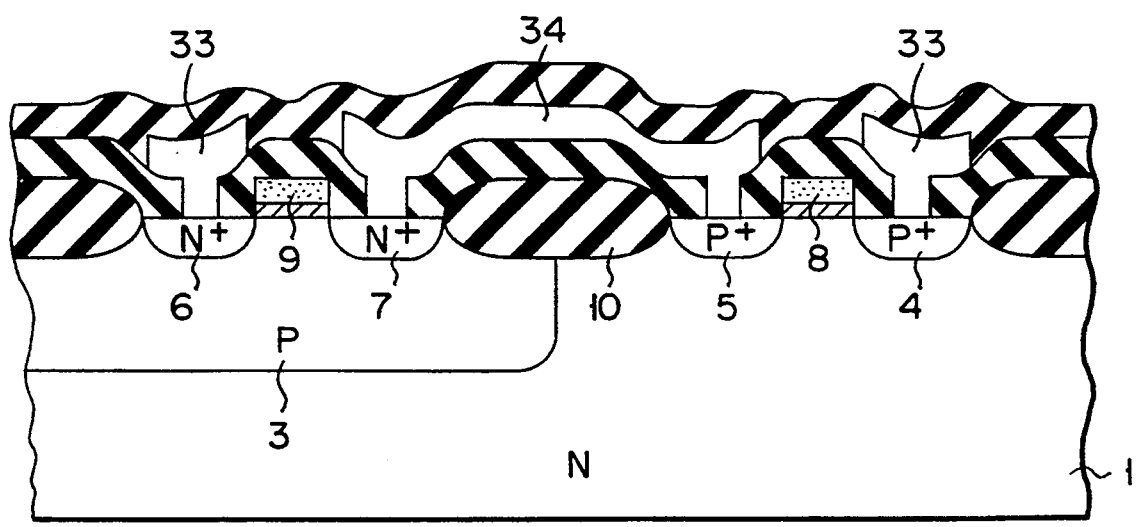
FIG. 2 is a cross sectional view showing an example of the conventional semiconductor device with multi-layered structure.
Figure 3:
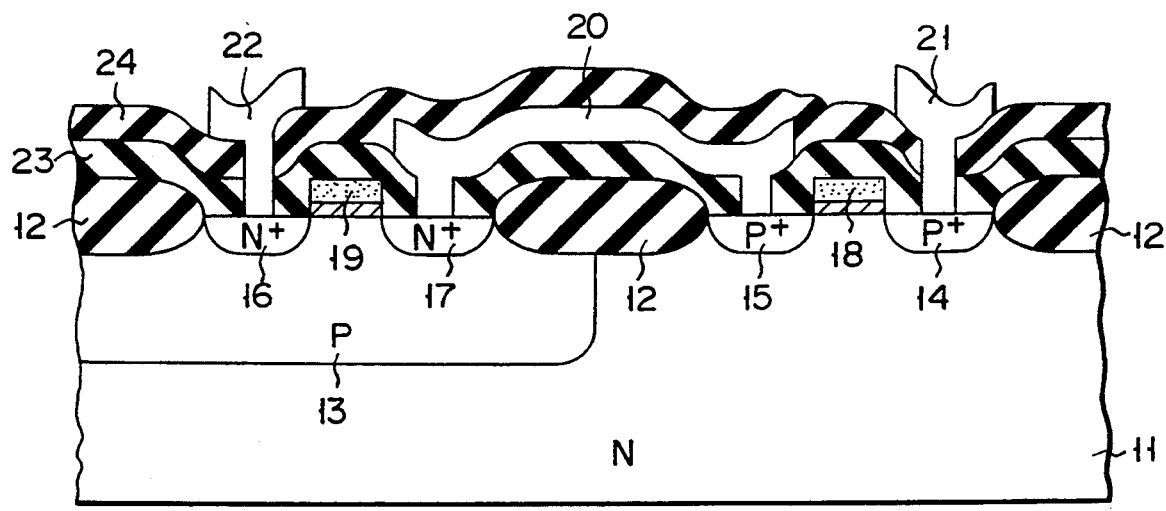
FIG. 3 is a cross sectional view showing an embodiment of a semiconductor device with multi-layered structure according to the present invention.

FIG. 3 is a cross sectional view showing an embodiment of a semiconductor device with multi-layered structure according to the present invention. In FIG. 3, an arrangement obtained when the present invention is applied to a CMOS-LSI including a CMOS inverter having P-channel and N-channel MOSFETs shown in FIG. 1 is shown. Reference numeral 11 denotes an N-type silicon semiconductor substrate; 12, a field oxide film for isolating the elements; 13, a P-type well region; 14 and 15, P+-type diffusion regions serving as the source and the drain of the P-channel MOSFET; 16 and 17, N+-type diffusion regions serving as the source and the drain of the N-channel MOSFET; 18 and 19, first wirings formed of polysilicon layers and serving as the gate electrodes of the P-channel and N-channel MOSFETs; 20, a second wiring formed by a first-layered metal for connecting the P+-type diffusion region 15 serving as the drain region of the P-channel MOSFET to the N+-type diffusion region 17 serving as the drain region of the N-channel MOSFET; 21 and 22, third wirings formed by a second-layered metal and, respectively, connected to the P+-type diffusion region 14 serving as the source region of the P-channel MOSFET and the N+-type diffusion region 16 serving as the source region of the N-channel MOSFET; and, 23 and 24, interlayer insulating films.

Figure 4:
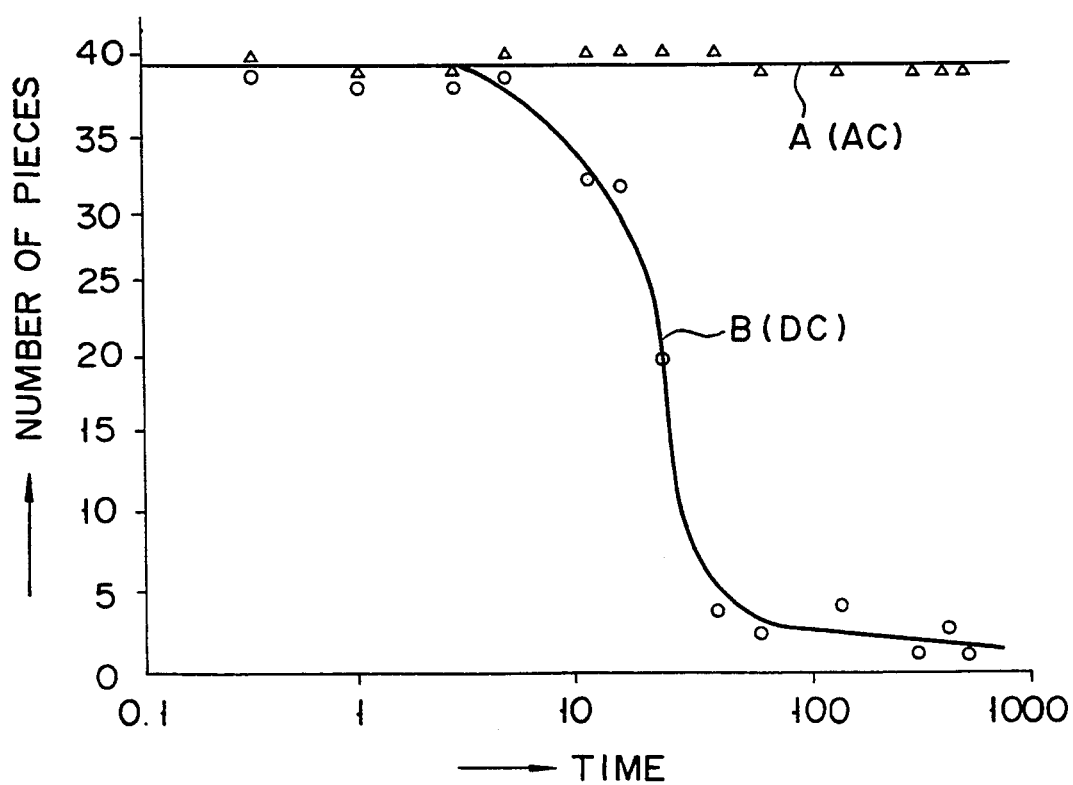
FIG. 4 is a characteristic diagram for illustrating the principle of the present invention.

FIG. 4 is a graph comparing the electromigration resistances respectively obtained when a DC current and an AC pulse current are caused to be flowed in the wirings. The abscissa indicates the elapsed time (hour), and the ordinate indicates the number of the wirings which are left unbroken among 40 Al wirings to be tested after the test has been completed. The comparison was performed under the condition that the temperature is at 250° C., the current density is at $2.0 \times 10^6 A/cm^2$, and the repeated frequency of the AC pulse current is at 1 kHz. As shown in FIG. 4, the rate of occurrence of the breakdown due to the electromigration in the characteristic A obtained when the AC pulse current flows through the wirings is significantly lower than that in the characteristic B obtained when the DC current flows through the wirings. Therefore, it is not necessary to pay much attention to the electromigration resistance of the signal wirings in which the AC pulse current is flowed. In the same manner as in the prior art, the signal wiring with the minimum dimension can be formed sufficiently thin of aluminum or the aluminum alloy which contains silicon, copper or the like therein. In contrast, since the time periods occurring defects in the characteristic B of the power line are shorter than those in the characteristic A of the signal line, it is necessary to pay sufficient attention to the electromigration. The characteristics A and B shown in FIG. 4 can be applied to the metals of all kinds.

In FIG. 3, the second wiring 20 is used as the signal line for transmitting the signals to other CMOS gates such as CMOS inverters (not shown) and receiving the signals therefrom. The wiring 20 can be formed of aluminum or the aluminum alloy in the same manner as in the prior art. The third wirings 21 and 22 are used as the power lines for respectively supplying a power source voltage and ground voltage to the CMOS inverters. Both third wirings 21 and 22 are formed of copper.

That is, in the above embodiment of the semiconductor device, the power line is formed of copper as a second-layered metal, and the signal line is formed of aluminum or the aluminum alloy as a first-layered metal.

In general, when an LSI having multi-layered wirings is formed, the lower wiring layer can be suitably formed in a thin and fine pattern since the insulating film under the wiring layer has to be made flat. The second wiring 20 can therefore be used as a signal line, in which a delay time for signal transmission due to the electric resistance causes no problem and also the electromigration causes no problem since the bidirectional pulse currents flow through the wiring 20. As a result, the second wiring 20 can be made sufficiently thin with the minimum dimension according to the process limit.

On the other hand, since the power lines 21 and 22 are formed of copper which has the high electromigration resistance, i.e., high melting point, the lines 21 and 22 can sufficiently withstand the electromigration caused by a DC current. Further, since the lines 21 and 22 are formed of copper which has a low resistivity, a voltage drop in the power line can be reduced and therefore an erroneous operation of the circuit element can be prevented.

This invention is not limited to the above embodiment, and it is of course possible to make various modifications. For example, in the above embodiment, the third wirings 21 and 22 used as the power lines are formed of copper, but a metal, which has a high melting point, a high electromigration resistance and a low resistivity such as gold, silver, or an alloy containing gold, silver, copper or the like as the main component, can be used for the wirings.

Further, in the embodiment shown in FIG. 3, the signal line is formed of the first-layered metal and the power line is formed of the second-layered metal. However, the power line can be formed of the first-layered metal and the signal line can be formed of the second-layered metal. In such case, it is of course that the power line must be formed of the metal having a high melting point, a high electromigration resistance and a low resistivity.

Further, the present invention is not limited to the above semiconductor device having two-layered wiring structure. A semiconductor device with three- or more-layered wiring structure and a semiconductor device other than the CMOS semiconductor device can also be constituted according to the present invention.

As described above, according to this invention, a highly reliable semiconductor device of multi-layered wiring structure can be provided since the power line is formed of the metal having a high melting point and a low resistivity.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device having a multi-layered wiring structure in which a plurality of switching elements connected to one another by means of multi-layered wiring are arranged, comprising:

a first wiring, of a metal selected from a group consisting of copper, gold, silver and an alloy having one of copper, gold and silver as a main component., for supplying electric power to each of said switching elements; and a second wiring, of a metal selected from a group consisting of aluminum and an aluminum alloy containing silicon and copper therein, for transmitting signals between said switching elements.

2. A semiconductor device according to claim 1, wherein said plurality of switching elements include gates, and wherein said second wiring includes a portion coupled to the gates.

3. A semiconductor device according to claim 1, wherein said plurality of switching elements is arranged in CMOS inverter configurations.

4. A semiconductor device according to claim 1, wherein said first wiring provides a power line in which a unidirectional DC current flows, and said second wiring provides a signal line in which bidirectional AC currents flow.

5. A semiconductor device according to claim 1, wherein said first and second wirings are wirings of different layers.

6. A semiconductor device according to claim 1, wherein a resistivity of said first metal of said first wiring is lower than a resistivity of said second metal of said second wiring.

7. A semiconductor device according to claim 1, wherein a melting point of said first metal of said first wiring is higher than that of said second metal of said second wiring.

8. A semiconductor device according to claim 1, wherein said plurality of switching elements includes gates, and wherein said second wiring further includes another portion coupled to the gates.

* * * * *

UNITED STATES PATENT AND TRADEMARK OFFICE
CERTIFICATE OF CORRECTION

PATENT NO. : 5,365,110
DATED : November 15, 1994
INVENTOR(S) : Fumitomo MATSUOKA It is certified that error appears in the above-indentified patent and that said Letters Patent is hereby corrected as shown below:

Claim 1, column 5, line 6, delete ".".

Signed and Sealed this

Fourth Day of July, 1995

Attest:

BRUCE LEHMAN

Attesting Officer     Commissioner of Patents and Trademarks